US012802767B2

(12) United States Patent
Ai et al.

(10) Patent No.: US 12,802,767 B2
(45) Date of Patent: Nov. 17, 2026

(54) POWER ON DATA RETENTION MANAGEMENT WITH DYNAMIC ACTIVATION ENERGY TABLE FOR NON-VOLATILE MEMORIES

(71) Applicant: Sandisk Technologies, Inc., Milpitas, CA (US)

(72) Inventors: Libo Ai, Shanghai (CN); Xia Ju, Shanghai (CN); Yinsen Dong, Shanghai (CN); Liang Li, Shanghai (CN)

(73) Assignee: Sandisk Technologies, Inc., Milpitas, CA (US)

(*) Notice: Subject to any disclaimer, the term of this patent is extended or adjusted under 35 U.S.C. 154(b) by 0 days.

(21) Appl. No.: 18/830,257

(22) Filed: Sep. 10, 2024

(65) Prior Publication Data

US 2026/0074001 A1 Mar. 12, 2026

(51) Int. Cl.
*G11C 16/34* (2006.01)
*G11C 29/36* (2006.01)

(52) U.S. Cl.
CPC ........ *G11C 16/349* (2013.01); *G11C 16/3418* (2013.01); *G11C 29/36* (2013.01)

(58) Field of Classification Search
CPC .............. G11C 16/349; G11C 16/0483; G11C 16/3418; G11C 29/36; G06F 3/0616
See application file for complete search history.

(56) References Cited

U.S. PATENT DOCUMENTS

| | | | | |
|---|---|---|---|---|
| 9,146,688 | B2 * | 9/2015 | Yang | G06F 3/064 |
| 9,478,292 | B2 * | 10/2016 | Sun | G11C 11/5635 |
| 9,639,282 | B2 * | 5/2017 | Kankani | G06F 3/0688 |
| 9,652,381 | B2 * | 5/2017 | Higgins | G06F 12/0253 |
| 9,715,939 | B2 * | 7/2017 | Ellis | G11C 16/10 |
| 10,430,112 | B2 | 10/2019 | Darragh et al. | |
| 11,404,127 | B1 | 8/2022 | Kumar et al. | |
| 2015/0135023 | A1 | 5/2015 | Mekhanik et al. | |
| 2016/0180959 | A1 * | 6/2016 | Darragh | G11C 16/12 365/185.09 |
| 2017/0091015 | A1 * | 3/2017 | Yadav | G06F 11/0754 |
| 2018/0046527 | A1 * | 2/2018 | Reusswig | G06F 11/004 |
| 2018/0059943 | A1 * | 3/2018 | Lueker-Boden | G06F 3/0611 |
| 2022/0254416 | A1 | 8/2022 | Kumar et al. | |
| 2022/0392553 | A1 * | 12/2022 | Wang | G11C 16/0483 |
| 2023/0368851 | A1 * | 11/2023 | Zhang | G11C 16/3454 |
| 2023/0420053 | A1 * | 12/2023 | Tian | G11C 29/50004 |

FOREIGN PATENT DOCUMENTS

| | | | | |
|---|---|---|---|---|
| CN | 117666972 A | * | 3/2024 | G06F 3/0679 |

* cited by examiner

*Primary Examiner* — B. James Peikari
(74) *Attorney, Agent, or Firm* — Pearl Cohen LLP

(57) ABSTRACT

A data retention management scheme is incorporated into the power on routine for non-volatile memory devices. Based on an activation energy, a data retention time is determined and used to decide on whether to perform a data retention operation, such as block recycling. To improve the accuracy of this process, a dynamic activation energy table that has different activation energy values for different temperature values and, for each temperature value, different activation energies for different device ages, such as beginning of life values and end of life values is used.

20 Claims, 20 Drawing Sheets

| | | | | | | | | | | | | |
|---|---|---|---|---|---|---|---|---|---|---|---|---|
| Temp | 25 | 26 | 27 | 28 | 29 | 30 | 31 | 32 | 33 | 34 | 35 | 36 |
| BOL | 0.79 | 0.79 | 0.79 | 0.8 | 0.8 | 0.8 | 0.8 | 0.81 | 0.81 | 0.82 | 0.83 | 0.84 |
| EOL | 0.69 | 0.69 | 0.69 | 0.69 | 0.69 | 0.69 | 0.69 | 0.70 | 0.70 | 0.70 | 0.71 | 0.72 |
| Temp | 37 | 38 | 39 | 40 | 41 | 42 | 43 | 44 | 45 | 46 | 47 | 48 |
| BOL | 0.85 | 0.86 | 0.87 | 0.88 | 0.89 | 0.9 | 0.91 | 0.93 | 0.95 | 0.97 | 0.98 | 0.99 |
| EOL | 0.73 | 0.73 | 0.74 | 0.75 | 0.76 | 0.76 | 0.77 | 0.79 | 0.80 | 0.82 | 0.82 | 0.83 |
| Temp | 49 | 50 | 51 | 52 | 53 | 54 | 55 | 56 | 57 | 58 | 59 | 60 |
| BOL | 1 | 1.01 | 1.02 | 1.03 | 1.04 | 1.05 | 1.06 | 1.06 | 1.06 | 1.06 | 1.06 | 1.06 |
| EOL | 0.84 | 0.84 | 0.85 | 0.86 | 0.87 | 0.87 | 0.88 | 0.88 | 0.88 | 0.88 | 0.88 | 0.88 |
| Temp | 61 | 62 | 63 | 64 | 65 | 66 | 67 | 68 | 69 | 70 | 71 | 72 |
| BOL | 1.07 | 1.07 | 1.07 | 1.07 | 1.07 | 1.07 | 1.07 | 1.07 | 1.07 | 1.07 | 1.07 | 1.07 |
| EOL | 0.88 | 0.88 | 0.88 | 0.89 | 0.89 | 0.89 | 0.89 | 0.89 | 0.89 | 0.89 | 0.89 | 0.89 |
| Temp | 73 | 74 | 75 | 76 | 77 | 78 | 79 | 80 | 81 | 82 | 83 | 84 |
| BOL | 1.07 | 1.08 | 1.08 | 1.08 | 1.08 | 1.08 | 1.08 | 1.08 | 1.08 | 1.08 | 1.08 | 1.08 |
| EOL | 0.89 | 0.89 | 0.89 | 0.89 | 0.89 | 0.90 | 0.90 | 0.90 | 0.90 | 0.90 | 0.90 | 0.90 |
| Temp | 85 | 86 | 87 | 88 | 89 | 90 | 91 | 92 | 93 | 94 | 95 | 96 |
| BOL | 1.08 | 1.08 | 1.08 | 1.08 | 1.09 | 1.09 | 1.09 | 1.09 | 1.09 | 1.09 | 1.09 | 1.09 |
| EOL | 0.90 | 0.90 | 0.90 | 0.90 | 0.90 | 0.90 | 0.90 | 0.90 | 0.91 | 0.91 | 0.91 | 0.91 |
| Temp | 97 | 98 | 99 | 100 | | | | | | | | |
| BOL | 1.09 | 1.1 | 1.1 | 1.1 | | | | | | | | |
| EOL | 0.91 | 0.91 | 0.91 | 0.91 | | | | | | | | |

Figure 11

POWER ON DATA RETENTION MANAGEMENT WITH DYNAMIC ACTIVATION ENERGY TABLE FOR NON-VOLATILE MEMORIES

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory, volatile memory or both. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

Memory devices will often have defects that occur as part of the fabrication process. After being manufactured and before being sent out to consumers, the memory die are usually put through a series of tests to determine defective portions of the circuit, both of the memory cells and also of peripheral elements. If a device has too many defects, it may be discarded or only used for less demanding applications, while in other cases the defective portions of the memory die can be marked and avoided when the device is in use. For example, the memory cells of a device will often be divided up into blocks. As part of the test process a flag value can be set for the defective memory blocks, such as in a fuse ROM on the memory die. Subsequently, these defective memory blocks will not be used when the device is in operation.

BRIEF DESCRIPTION OF THE DRAWINGS

Like-numbered elements refer to common components in the different figures.

FIG. 11 illustrates an example of a dynamic activation energy table.

DETAILED DESCRIPTION

Improvement of data retention is an important goal for non-volatile memory, particularly as such devices age. Data quality can deteriorate with both time and use, so that as devices age, memory management techniques for improving data retention, such a block recycling, can be performed based on a determined data retention time. It is important that a determined data retention is accurate, since if the data retention time is underestimated, resources can be wasted by rotating out blocks that still has significant life left; and if the determined data retention is overestimated data retention time is underestimated, data can be lost by continuing to use blocks that should have been retired.

To address these issues, embodiments presented below incorporate a data retention management scheme into the power on routine for non-volatile memory devices. Based on an activation energy, a data retention time is determined and used to decide on whether to perform a data retention operation, such as block recycling. To improve the accuracy of this process, a dynamic activation energy table that has different activation energy values for different temperature values and, for each temperature value, different activation energies for different device ages, such as beginning of life values and end of life values, is used.

Figure 1:
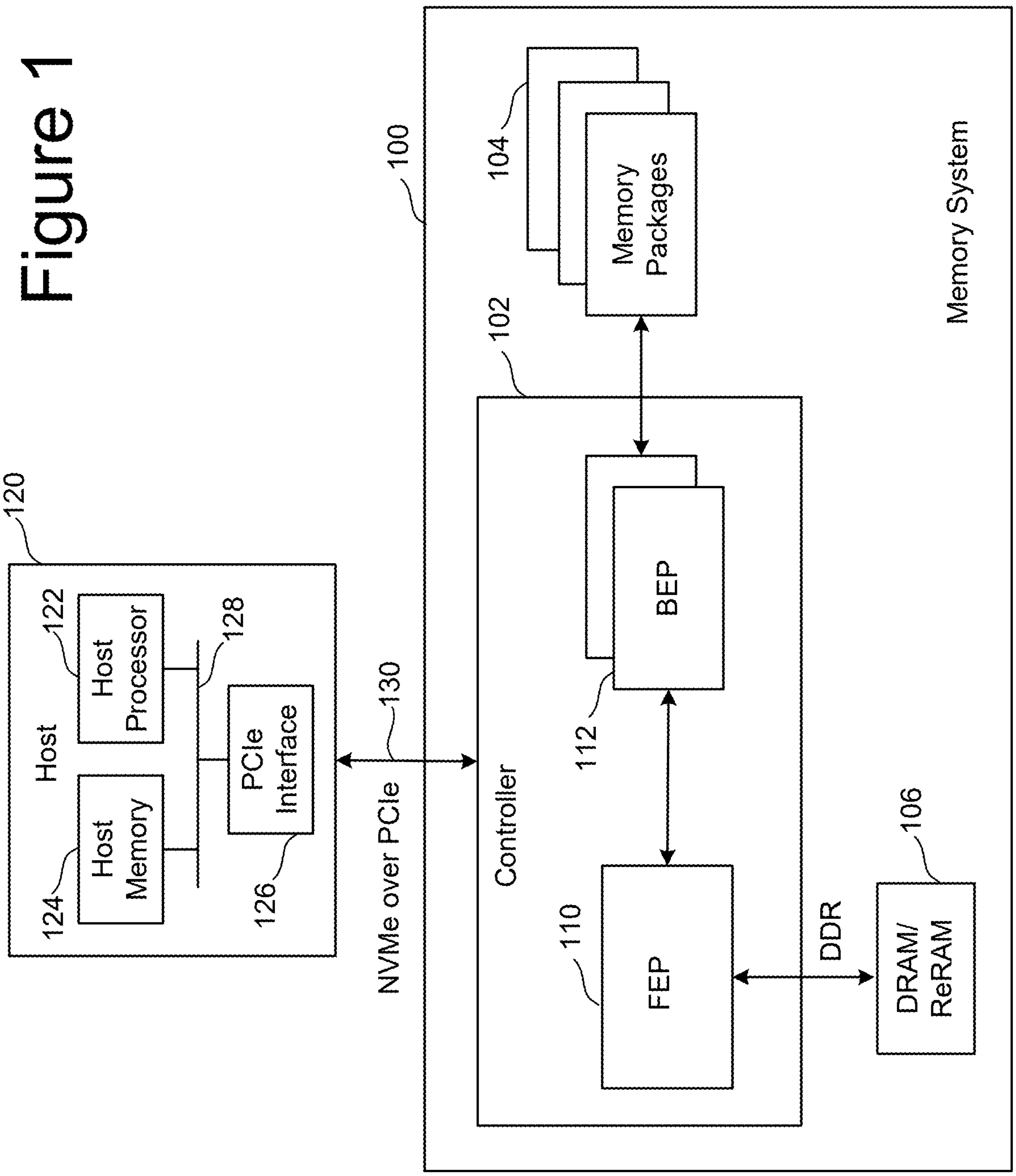
FIG. 1 is a block diagram of one embodiment of a memory system connected to a host.

FIG. 1 is a block diagram of one embodiment of a memory system 100 connected to a host 120. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an application-specific integrated circuit ("ASIC"). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction code (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
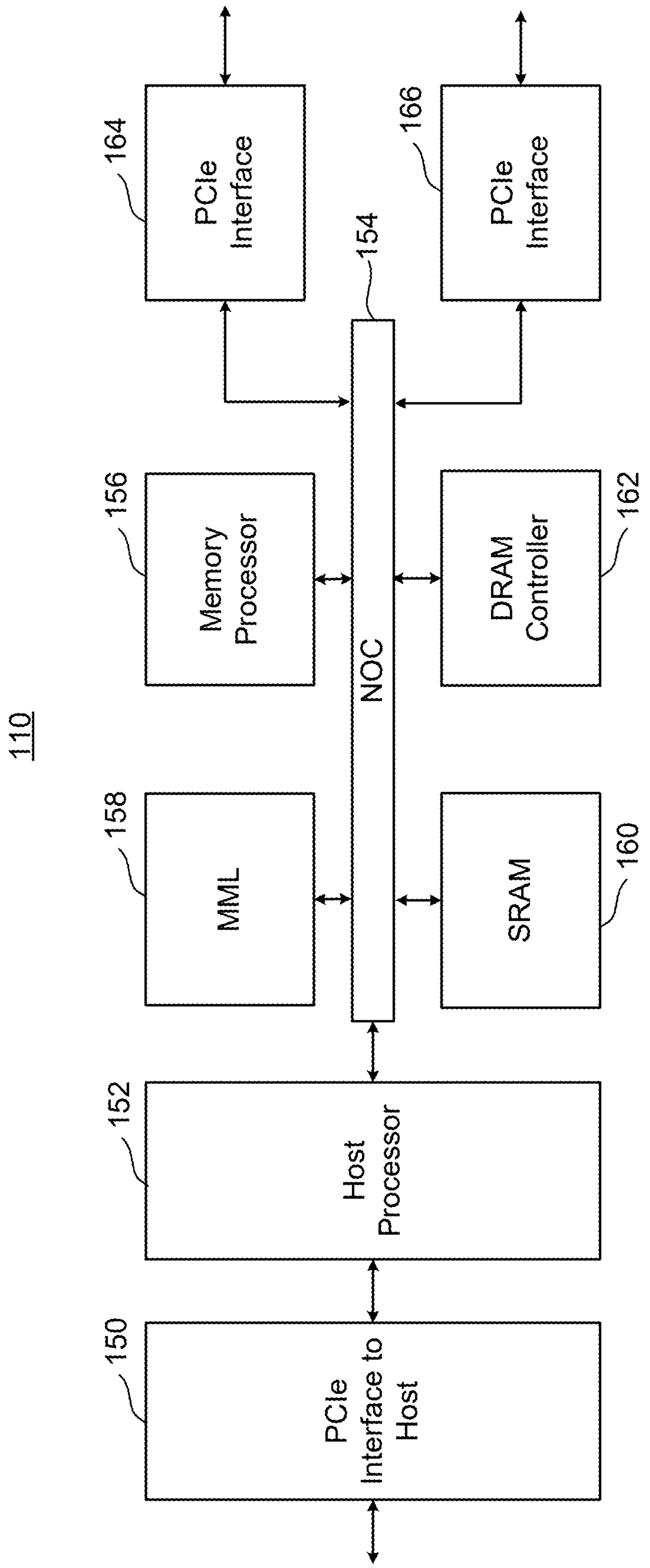
FIG. 2 is a block diagram of one embodiment of a Front End Processor Circuit. In some embodiments, the Front End Processor Circuit is part of a controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 302 of FIGS. 5A and 5B below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
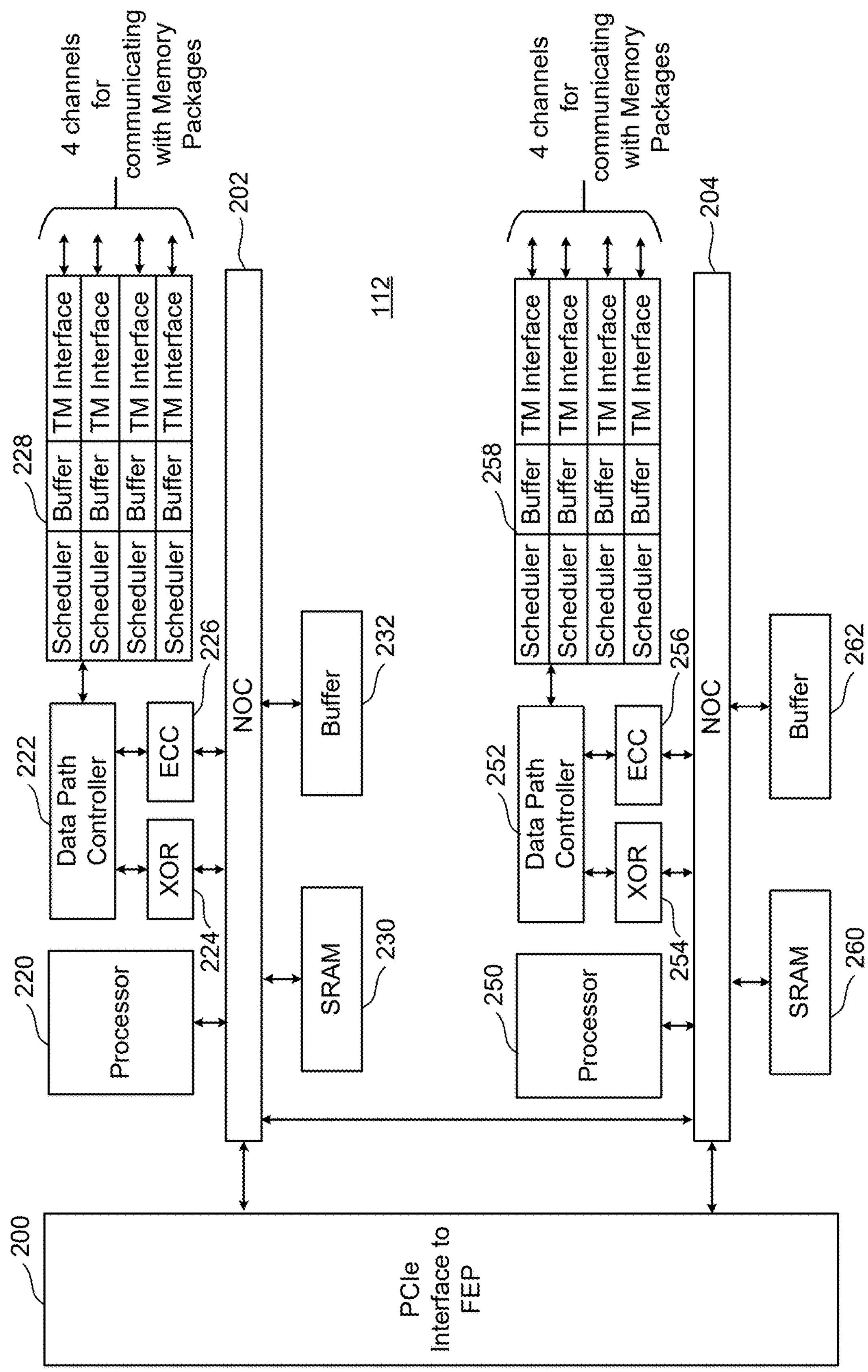
FIG. 3 is a block diagram of one embodiment of a Back End Processor Circuit. In some embodiments, the Back End Processor Circuit is part of a controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
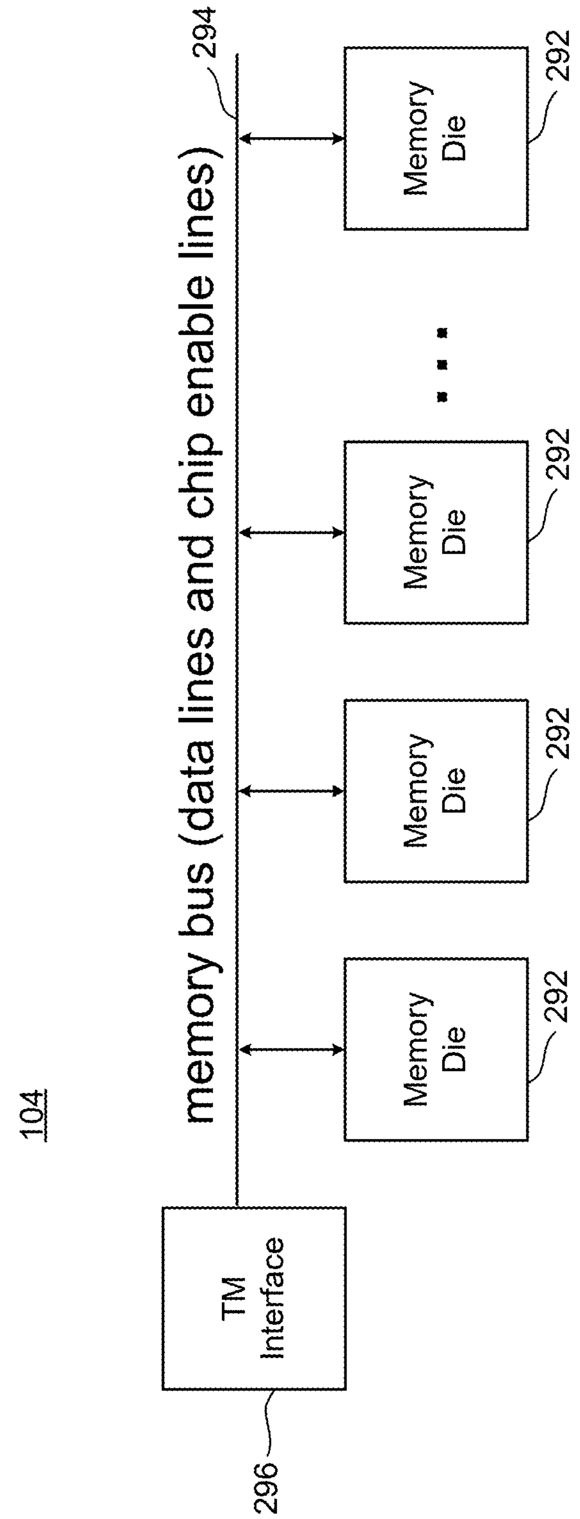
FIG. 4 is a block diagram of one embodiment of a memory package.

FIG. 4 is a block diagram of one embodiment of a memory package 104 that includes a plurality of memory die

292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5A:
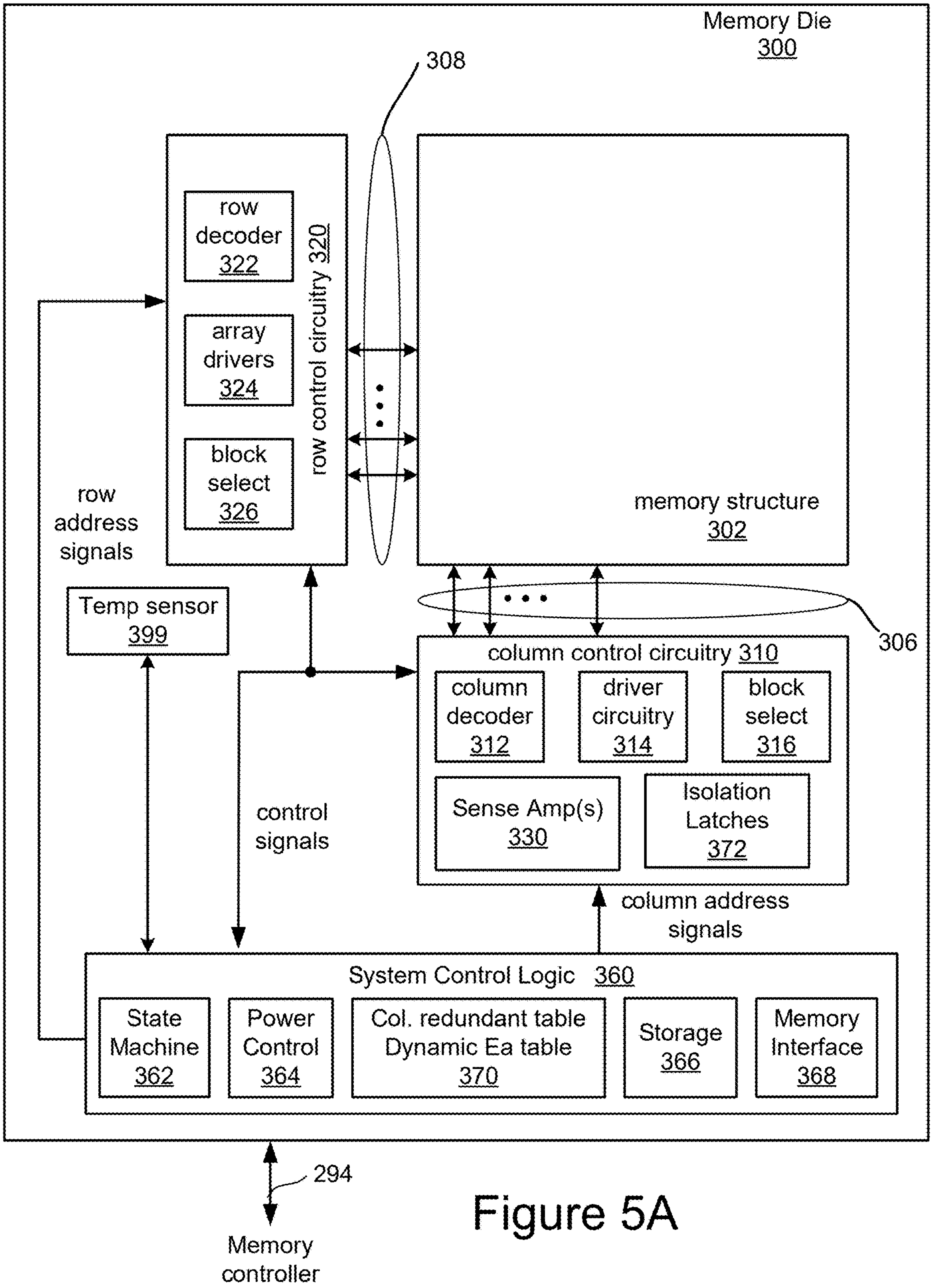
FIG. 5A is a functional block diagram of an embodiment of a memory die.

FIG. 5A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only a single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

The memory structure 302 is divided into primary regions (e.g., primary rows, primary columns) and redundant regions (redundant rows, redundant columns). In the event that a primary region is defective one of the redundant regions will serve as a replacement for the defective primary column. For example, in the event that a primary column is defective one of the redundant columns will serve as a replacement for the defective primary column. The column control circuitry 310 has isolation latches 372. Each isolation latch 372 corresponds to a column of the memory structure 302 and indicates a state of that column. In an embodiment, the isolation latches 372 contain a first set of isolation latches that each correspond to a primary column and a second set of isolation latches that each correspond to a redundant column. Details of setting and resetting the isolation latches 372 are discussed below. In one embodiment, the row control circuitry 320 has isolation latches that serve a similar purpose for defective rows (e.g., defective blocks).

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 that controls the power and voltages supplied to the rows and columns of the memory structure 302 during memory operations and may include charge pumps and regulator circuit for creating regulating voltages.

System control logic 360 includes storage 366, which may be used to store parameters for operating the memory array 302. The storage 366 may include volatile and/or non-volatile storage. The storage 366 may include one or more registers, which may be used to store operating parameters. In one embodiment, the parameters are stored in the memory array 302 and transferred to the storage 366 upon power up of the memory die 300 (during a power on read).

Among the parameters stored in the storage 366 for the system control logic 360 can be included tables 370, such as a column redundancy table and a dynamic activation energy (Ea) table. The dynamic activation table will be discussed in more detail below, beginning with FIG. 9. The column redundancy table 370 stores a mapping from each defective primary column in the memory structure 302 to a corresponding redundant column that will serve as a replacement to the defective primary column. In an embodiment, a copy of this mapping is stored in non-volatile memory cells in the memory structure 302 and loaded into the column redundancy table 370 during power on of the memory die 300. The column redundancy table 370 may be stored in volatile or non-volatile memory. In an embodiment, a copy of the column redundancy table 370 is stored in the memory controller 102.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "one or more control circuits" can include a controller, a state machine, a micro-controller, micro-processor, and/or other control circuitry as represented by the system control logic 360, or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that is monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5A can be grouped into two parts, the structure of memory structure 302 of the memory cells and the peripheral circuitry, including all of the other elements. An important characteristic of a memory circuit is its capacity, which can be increased by increasing the area of the memory die of memory system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the memory system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 5B:
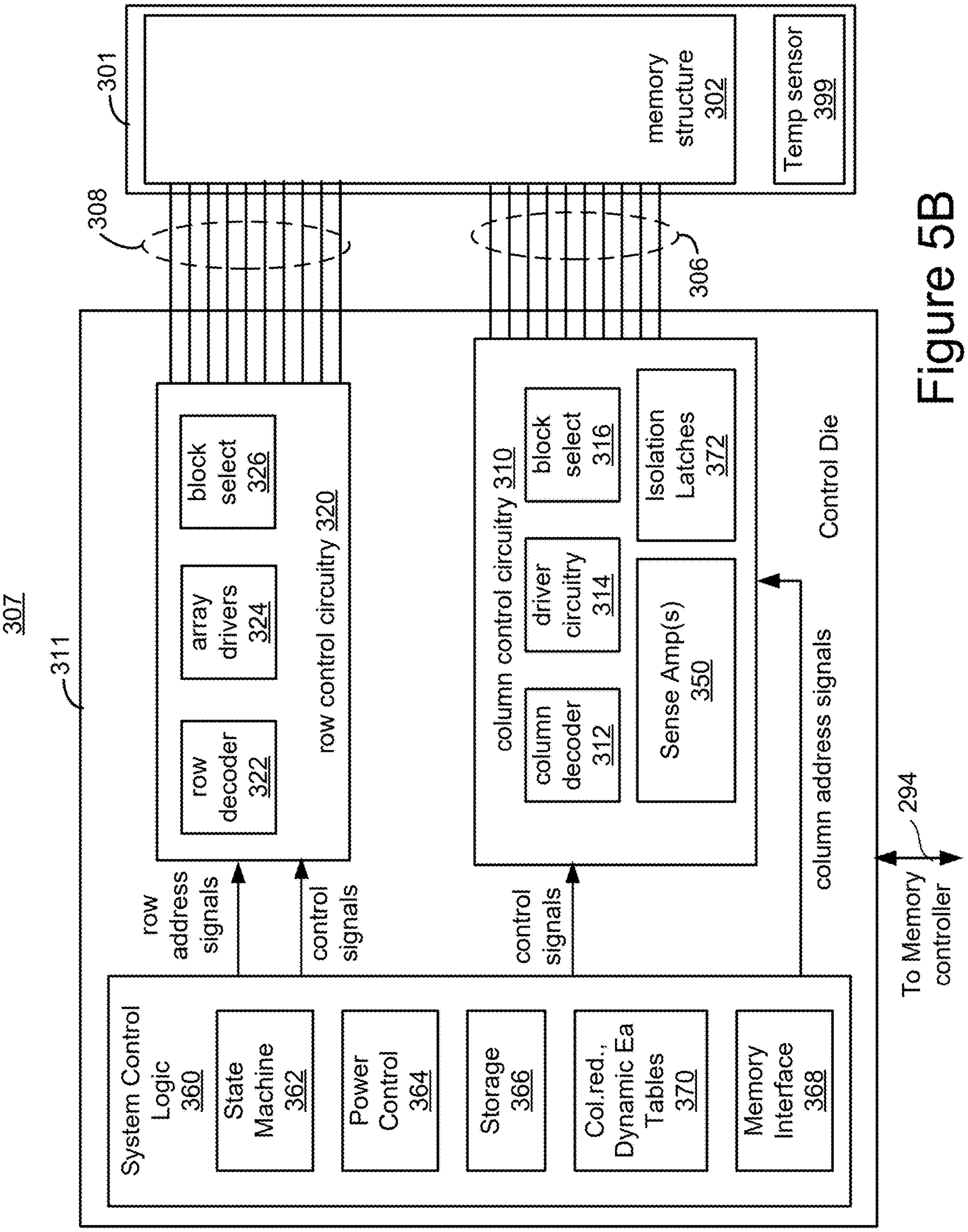
FIG. 5B is a functional block diagram of an embodiment of an integrated memory assembly.

FIG. 5B shows an alternative arrangement to that of FIG. 5A which may be implemented using wafer-to-wafer bonding to provide a bonded die pair. FIG. 5B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 5B shows an example of the peripheral circuitry, including control circuits, formed in a peripheral circuit or control die 311 coupled to memory structure 302 formed in memory structure die 301. Common components are labelled similarly to FIG. 5A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 5B shows column control circuitry 310 including sense amplifier(s) 330 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each electrical path 308 may correspond to a word line, dummy word line, or select gate line. Additional electrical paths may also be provided between control die 311 and memory structure die 301.

For purposes of this document, the phrase "one or more control circuits" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 6A:
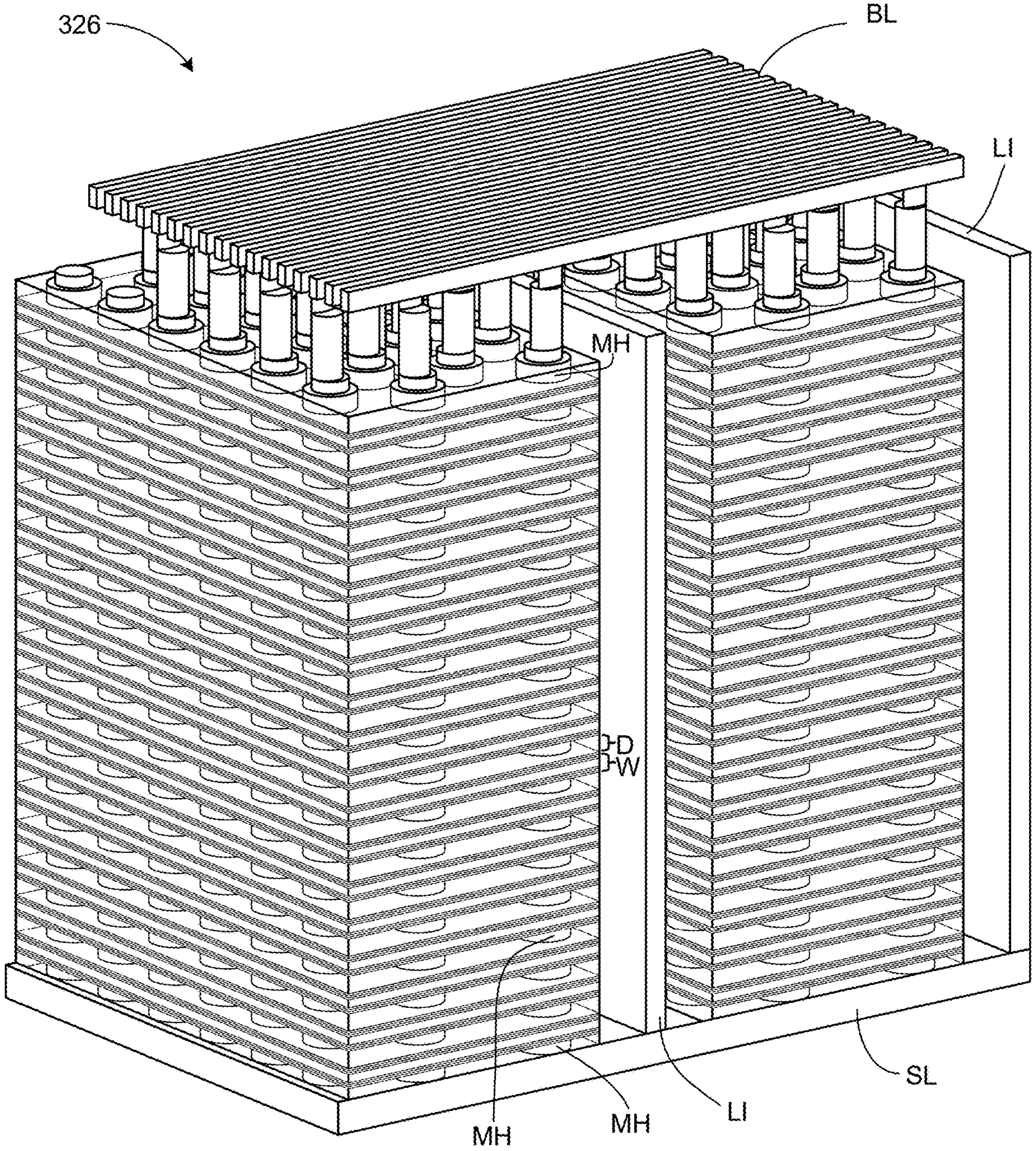
FIG. 6A is a perspective view of a portion of one embodiment of a monolithic three dimensional memory structure.

FIG. 6A is a perspective view of a portion of one example embodiment of a monolithic three-dimensional (3D) memory array that can correspond to memory structure 302, which includes a plurality non-volatile memory cells. For example, FIG. 6A shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 6A shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 6A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 302 is provided below with respect to FIGS. 6B-6H.

Figure 6B:
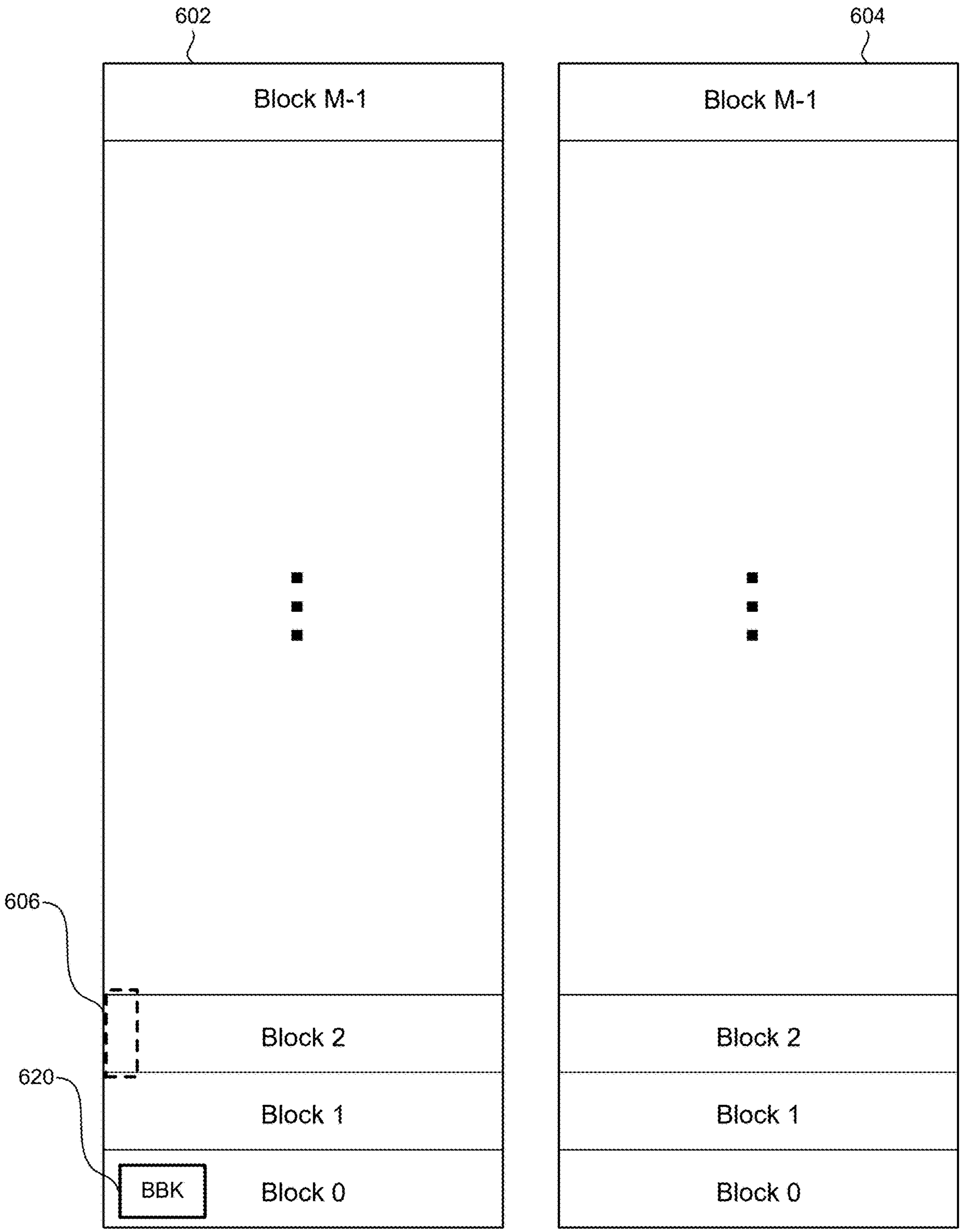
FIG. 6B is a block diagram of a memory structure having two planes.

FIG. 6B is a block diagram explaining one example organization of memory structure 302, which is divided into two planes 602 and 604. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, memory cells can be grouped into blocks for other reasons, such as to organize the memory structure 302 to enable the signaling and selection circuits. In some embodiments, a block represents a group of connected memory cells as the memory cells of a block share a common set of word lines. The memory blocks can be used to store both user data received from a host 120 and also to store system data, such as operating parameters and other data that the memory die 300 or controller 102 can use for operating the memory system 100. For example, as shown in FIG. 6B block 0 620 of plane 602 is used for storing system data, such as the bad block flags BBK that are discussed in more detail below. The system data block 620 is here shown in Block 0, but can be located in other blocks and its content can be used similarly to the 366.

Figure 6C:
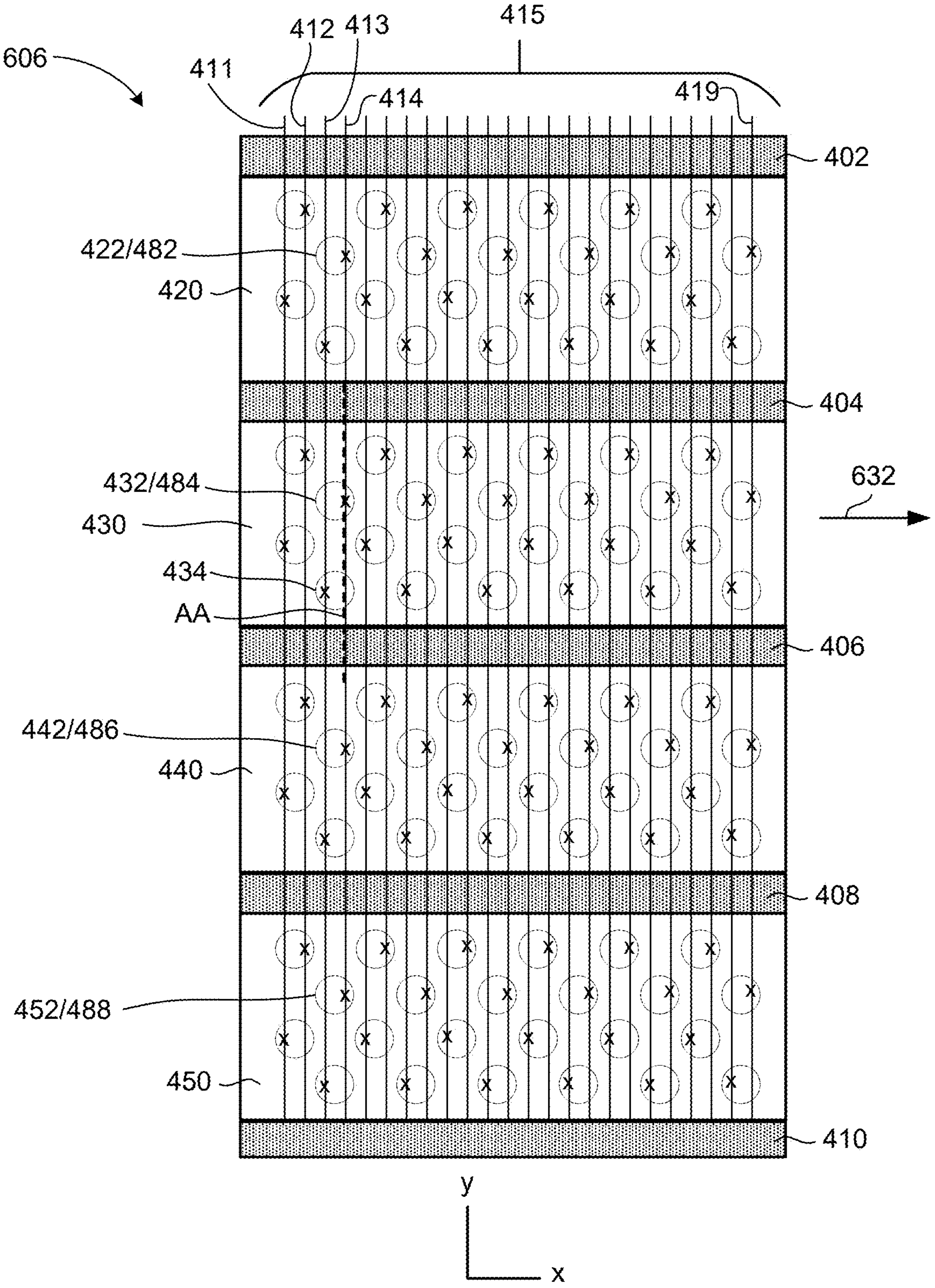
FIG. 6C depicts a top view of a portion of a block of memory cells.

FIGS. 6C-6H depict an example 3D NAND structure that corresponds to the structure of FIG. 6A and can be used to implement memory structure 302 of FIGS. 5A and 5B. FIG. 6C is a block diagram depicting a top view of a portion of one block from memory structure 302. The portion of the block depicted in FIG. 6C corresponds to portion 606 in block 2 of FIG. 6B. As can be seen from FIG. 6C, the block depicted in FIG. 6C extends in the direction of arrow 632. In one embodiment, the memory array has many layers; however, FIG. 6C only shows the top layer.

FIG. 6C depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 6C depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 6C extends in the direction of arrow 632, the block includes more vertical columns than depicted in FIG. 6C FIG. 6C also depicts a set of bit lines 415, including bit lines 411, 412, 413, 414, . . . 419. FIG. 6C shows twenty four bit lines because only a portion of the block is depicted. It is contemplated that more than twenty four bit lines are connected to vertical columns of the block. Each of the circles representing vertical columns has an "x" to indicate its connection to one bit line. For example, bit line 414 is connected to vertical columns 422, 432, 442 and 452.

The block depicted in FIG. 6C includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 6C is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 6C shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 6C also shows the vertical columns being staggered. In other embodiments, different patterns of staggering can be used. In some embodiments, the vertical columns are not staggered.

Figure 6D:
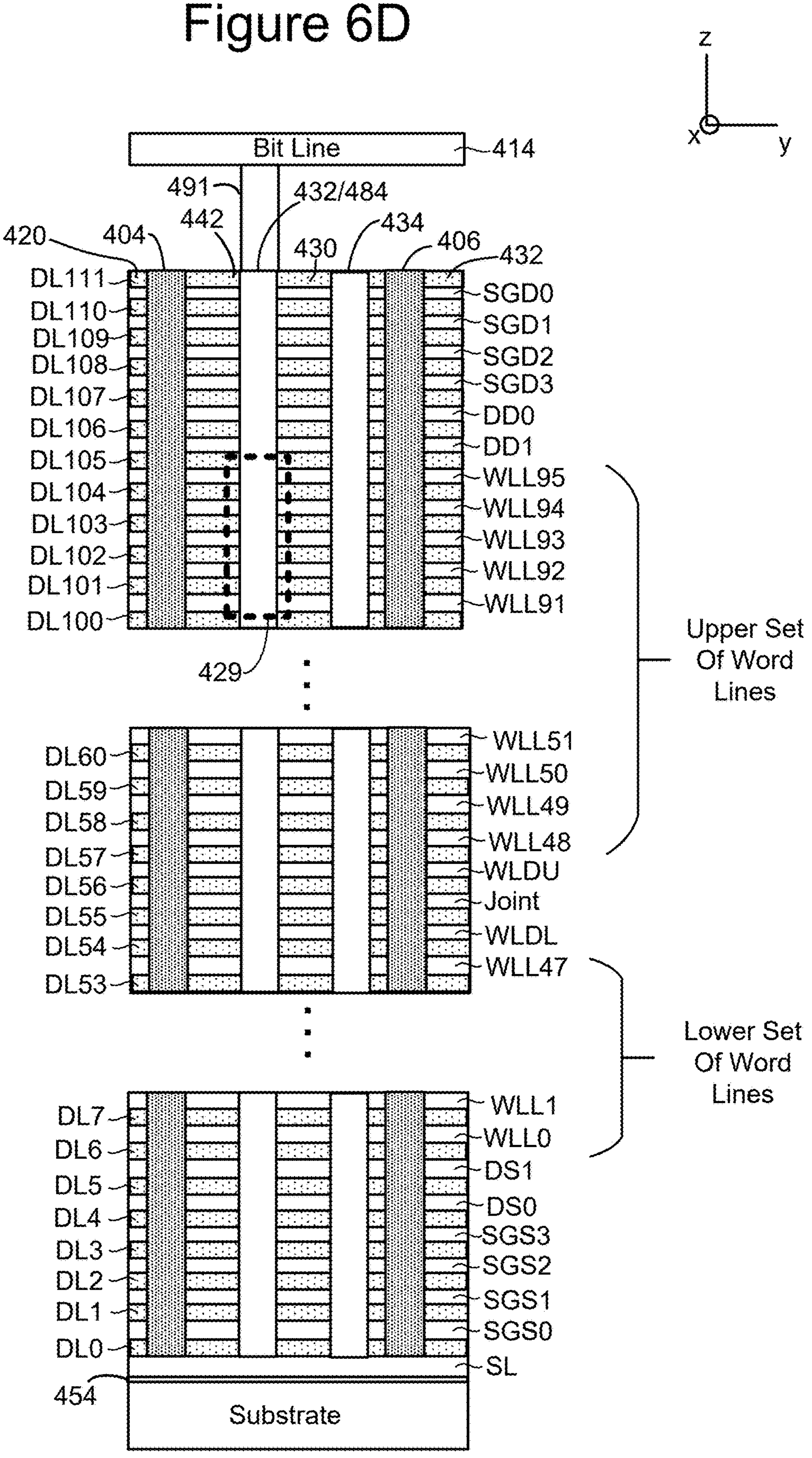
FIG. 6D depicts a cross sectional view of a portion of a block of memory cells.

FIG. 6D depicts a portion of one embodiment of a three dimensional memory structure 302 showing a cross-sectional view. This cross sectional view cuts through vertical columns 432 and 434 and region 430 (see FIG. 6C). The structure of FIG. 6D includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is a substrate, an insulating film 454 on the substrate, and source line SL. The NAND string of vertical column 432 has a source end at a bottom of the stack and a drain end at a top of the stack. As in agreement with FIG. 6C, FIG. 6D show vertical column 432 connected to Bit Line 414 via connector 491. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten, or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 6D also shows a joint area. In one embodiment it is expensive and/or challenging to etch ninety six word line layers intermixed with dielectric layers. To case this burden, one embodiment includes laying down a first stack of forty eight word line layers alternating with dielectric layers, laying down the joint area, and laying down a second stack of forty eight word line layers alternating with dielectric layers. The joint area is positioned between the first stack and the second stack. The joint area is used to connect to the first stack to the second stack. In FIG. 6D, the first stack is labeled as the "Lower Set of Word Lines" and the second stack is labeled as the "Upper Set of Word Lines." In one embodiment, the joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 6D.

Figure 6E:
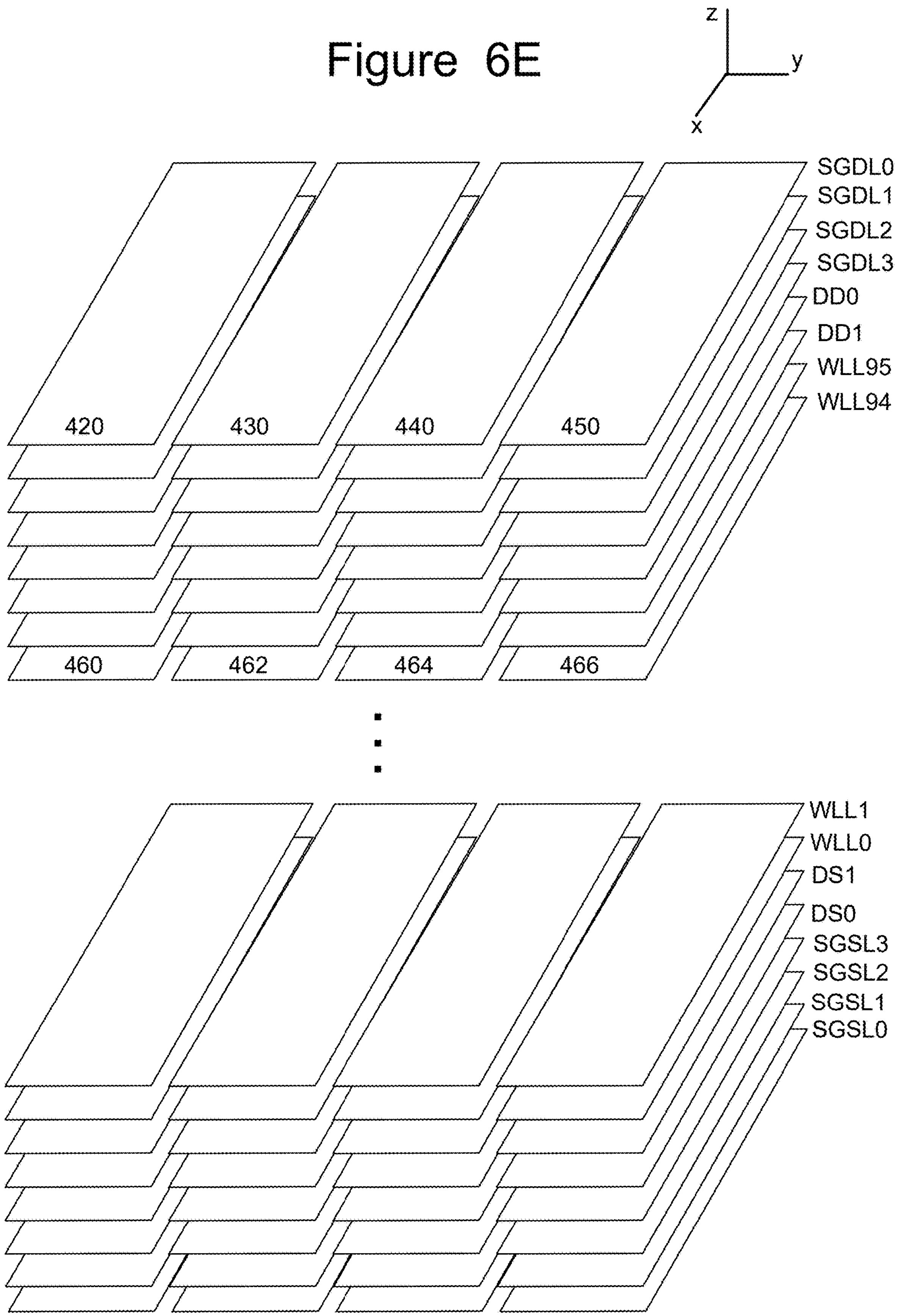
FIG. 6E depicts a view of the select gate layers and word line layers.

FIG. 6E depicts a logical representation of the conductive layers (SGDL0, SGDL1, SGDL2, SGDL3, SGSL0, SGSL1, SGSL2, SGSL3, DDL0, DDL1, DSL0, DSL1, and WLLL0-WLLL95) for the block that is partially depicted in FIG. 6D. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGDL0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 6F:
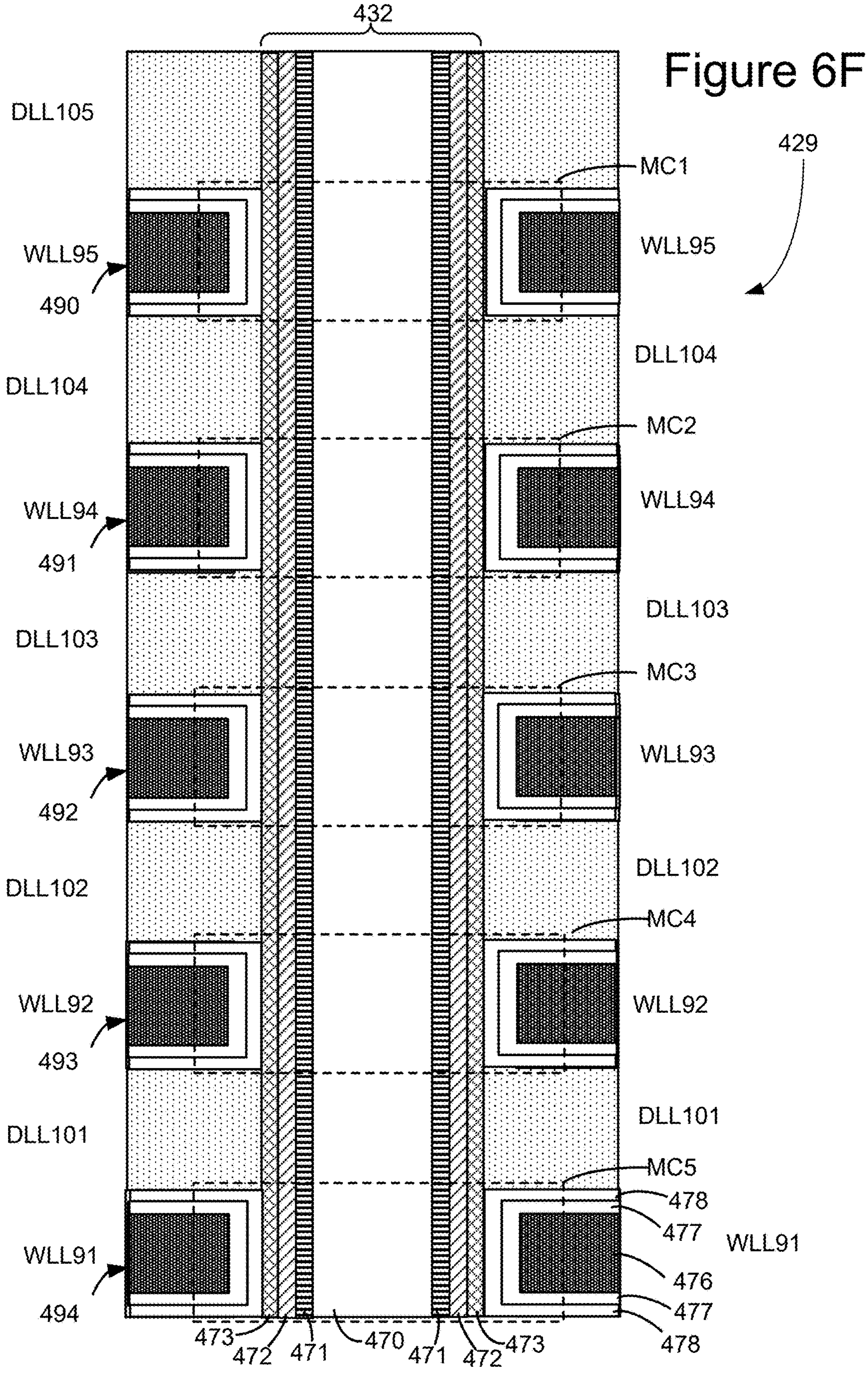
FIG. 6F is a cross sectional view of a vertical column of memory cells.

FIG. 6F depicts a cross sectional view of region 429 of FIG. 6D that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other dielectric materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 6F depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 6G:
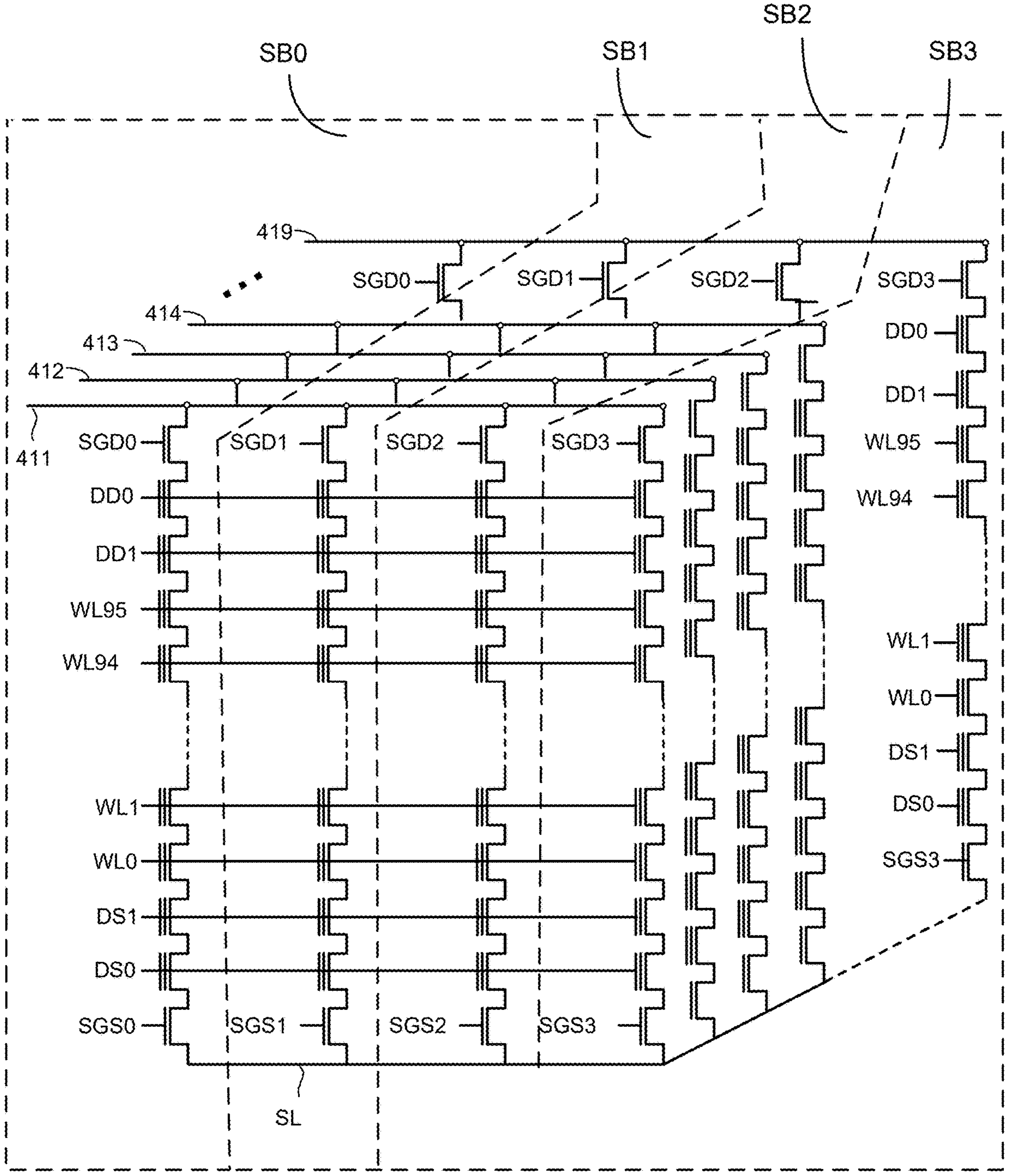
FIG. 6G is a schematic of a plurality of NAND strings showing multiple sub-blocks.

FIG. 6G is a schematic diagram of a portion of the memory depicted in in FIGS. 6A-6F. FIG. 6G shows physical word lines WL0-WL95 running across the entire block, corresponding to the word line layers WLL0-WLL95. The structure of FIG. 6G corresponds to portion 606 in Block 2 of FIGS. 6B-6F, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although non-volatile memories, such as the NAND structures discussed above, maintain their data content when power is off, data retention is still an important concern as the stored data content can still degrade over time. In the case of NAND memory, data values are based on the amount of stored charge in a memory cell. Over time, charge can leak from the charge storage region and the memory cells are also subject to disturbs, where operations such as program, erase, and read performed on one set of memory cells can affect the charge level on other memory cells as well as on themselves. A number of techniques are used to improve data retention, such as periodic data relocation and data scrub and various block management techniques. Such data retention techniques can be incorporated into the power on routines that are performed with a memory device is started up after having off for some time.

Figure 7:
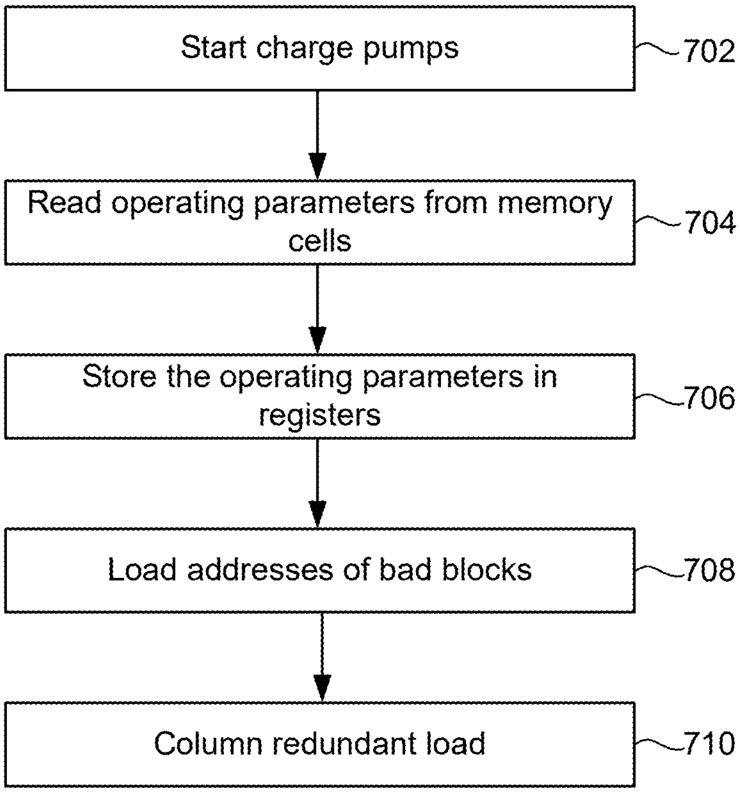
FIG. 7 depicts a flowchart of one embodiment of a power on read.

Consequently, a memory die having the memory structure will from time to time undergo a power on sequence, in which information for operating the memory structure may be read from non-volatile memory cells in the memory structure. This sequence may be referred to as a power on read (POR). FIG. 7 depicts a flowchart of one embodiment of a POR. Step 702 includes starting charge pumps and waiting for charge pumps to power on. The charge pumps are used to supply voltages to the memory structure to, for example, read the memory cells. Step 704 includes reading a portion of the memory structure that stores operating parameters. These operating parameters may include parameters such as voltages used during program, erase, etc. Step 706 includes storing the operating parameters into temporary registers on the memory die. Step 708 include a bad block load. A bad (or defective) block is an example of a bad (or defective) region. Step 708 is used to load a list of which blocks in the memory structure are defective (bad). This list of bad blocks can be determined at time of manufacture based on device tests, and stored in non-volatile memory cells in a portion of the memory structure. Step 710 includes a column redundancy load. The column redundancy load is used to load information about which columns are bad (or defective). A bad (or defective) column is an example of a bad (or defective) region. This list of defective columns can be determined at time of manufacture based on device tests, and stored in non-volatile memory cells in a portion of the memory structure. In some techniques the memory structure contains a table that maps addresses of defective columns to addresses of redundant columns.

Figure 8:
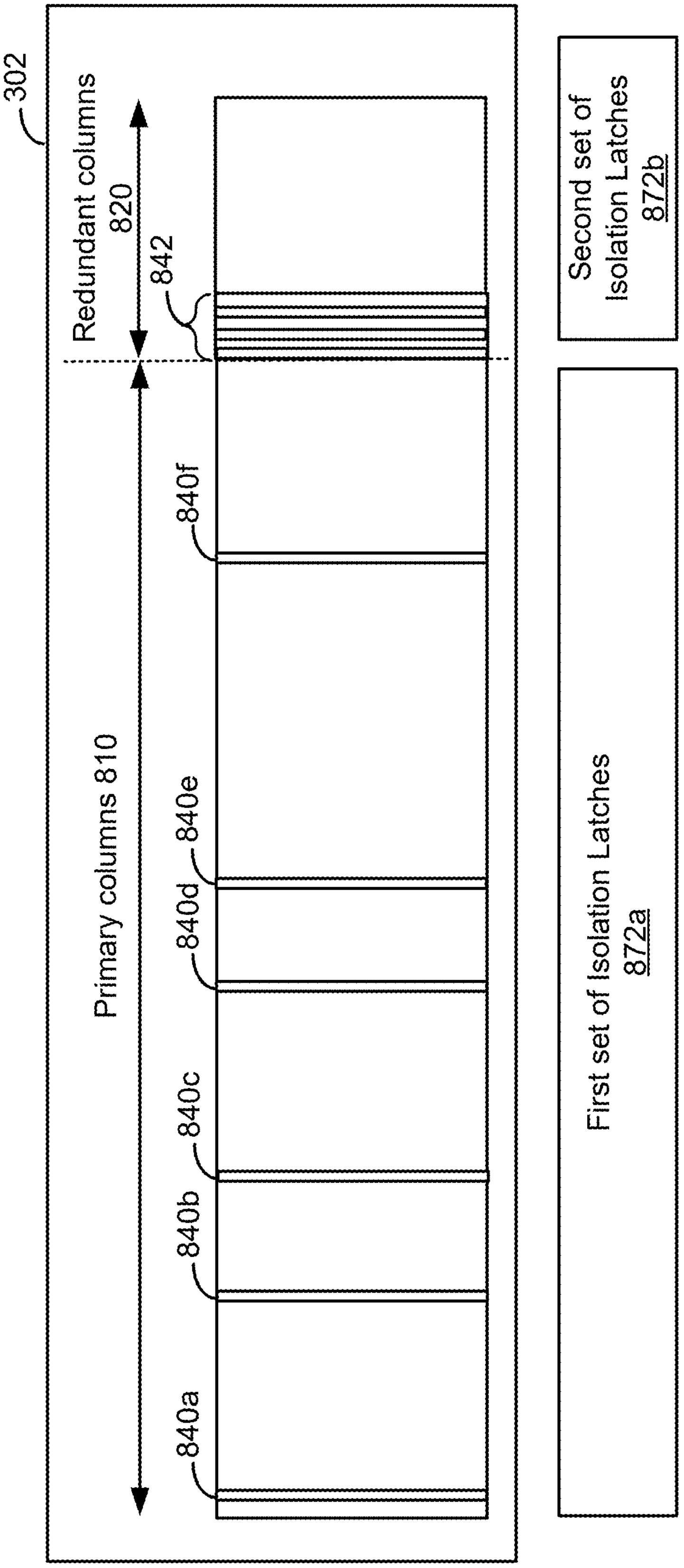
FIG. 8 depicts an example configuration of a memory structure arranged in an area having primary columns and an area having redundant columns.

FIG. 8 depicts an example configuration of a memory structure 302, where the memory structure is arranged in an area having primary columns 810 and an area having redundant columns 820. In one embodiment, each column has a width of one word, which could be 16 bits, 32 bits or some other size. A primary column is a column which does not replace a defective column but is intended to be used to store data as long as it is not defective. A redundant column (replacement column) may replace a defective primary column. However, some of the redundant columns may be unused, depending on the number of defective primary columns. The number of redundant columns is much less than the number of primary columns, e.g., <1% of the number of primary columns.

The defective primary columns may be detected when the memory structure 302 is manufactured, prior to using the memory structure 302 in the field. FIG. 8 shows six example defective primary columns 840*a*-840*f*. There are a corresponding six redundant columns 842 that are in use as replacement columns. The column redundancy table 370 contains a mapping of the address of each respective defective primary column 840 to the corresponding redundant column 842 that replaces the defective primary column 840 for memory operations. The rest of the redundant columns 820 are not in use. During a program operation, the data to be programmed may be diverted from a defective primary column 840 to the replacement redundant column 842. During a read operation, the data is read from the replacement redundant column 842 instead of the defective primary column 840.

In one embodiment, there is an isolation latch 372 for each column in order to store the status of that column. Each latch in the first set of isolation latches 872*a* stores the status of one of the primary columns 810. Each latch in the second set of isolation latches 872*b* stores the status of one of the redundant columns 820.

In one embodiment, the memory structure 302 has an area with primary rows and an area having redundant rows. In one embodiment, each row has a width of one word, which could be 16 bits, 32 bits or some other size. However, a row could have a size that is not equal to one word (e.g., the row could be larger than a word such as a block). In one embodiment, there is an isolation latch for each row in order to store the status of that row. In an embodiment, each latch in one set of isolation latches stores the status of one of the primary rows. In an embodiment, these latches for the primary rows are reset and set in a similar manner as the first set of isolation latches 872*a* for the primary columns. In an embodiment, each latch in another set of isolation latches stores the status of one of the redundant rows. In an embodiment, these latches for the redundant rows are reset and set in a similar manner as the second set of isolation latches 872*b* for the primary columns.

As part of the power on process, there is the reading of operating parameters from the non-volatile memory at step 704, which are then stored in the registers in the control system logic 360 at step 706. This includes the reading of values such as read levels and parameters related to data retention operations. As device operation is dependent upon factors such as operating temperature and device aging, these parameters also often adjusted based on temperature and time and/or experience counts (i.e., number of program/erase cycles). Consequently, the power on sequence will often include a temperature and time determination. This is illustrated in FIG. 9.

Figure 9:
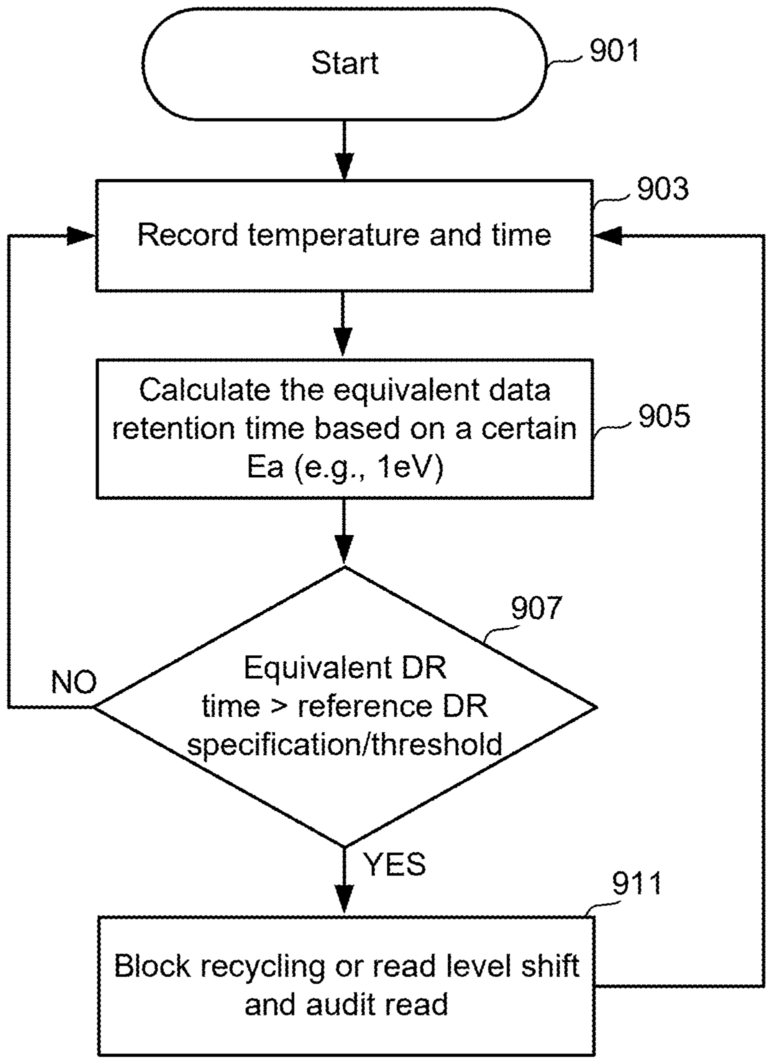
FIG. 9 is a simplified flowchart of an embodiment for the incorporation of data retention management into a power on process.

FIG. 9 is a simplified flowchart of an embodiment for the incorporation of data retention management into a power on process. The sub-process of FIG. 9 begins at step 901 that, for instance, can be triggered by the system control logic 360 as part of step 704. Step 903 records the current temperature of the system and a time value. For example, the memory die 300 or 301 can include a temperature sensor 399 that the system control logic 360 can use to determine the temperature of a memory array on the memory die 300/301 and record the value as a parameter. The time value can be, for example, a time stamp stored in the system data in the non-volatile memory at the previous shut down. A current time from the memory controller 102 can then be used to determine the elapsed time since the previous shutdown.

The extent of data degradation of a NAND or other non-volatile memory when not in operation will typically not only depend on time, but also on the temperature, as the stored charge carriers will be more active at higher temperature. To account for this, the time can be adjusted based on the activation energy (Ea), which can be thought of as the magnitude of the potential barrier separating the minima of the potential energy surface pertaining to the initial and final thermodynamic state. A "thermal acceleration factor" (AF) to account for this can be defined as:

$$AF = e^{\frac{E_a\left(\frac{1}{T_0}-\frac{1}{T}\right)}{k}},$$

where Ea is a fixed activation energy, typically expressed in electron volts (eVs); k is the Boltzmann constant; To is a reference temperature; and Ti is the operating temperature. The reference temperature can be taken as a standard operation temperature, such as 55 C, that might be used at test time form device characterization. The equivalent data retention time at a reference temperature can then be taken as AF times the time interval at an optimal temperature.

Activation energy can consequently provide not only a guideline for the standard NAND qualification, but also the system power on data retention management strategies. The equivalent data retention time is calculated at step 905, where this can be based on a certain fixed Ea value, such a 1 eV. The system can then calculate the equivalent data retention time at different temperatures through Ea.

If, at step 907, the equivalent data retention time at a reference temperature calculated by different temperatures exceeds a data retention specification value or threshold, the system performs a block recycling or RL shift+audit read at step 911, before looping back to step 903. NAND memory and other memory technologies manage memory at a block level, substituting in block that have lower amount of wear (i.e., program/erase cycles) for other memory blocks that had previously had higher wear. An RL shift is a shift in read level voltages to try to recover data (an audit read) to recover stored data values.

However, an activation energy value is not a universal number once going to high endurance due to multiple mechanisms that can lead to data loss and reduced data retention. Consequently, even with incorporating the thermal activation factor, high temperature and low temperature should preferably have different activation energy values. Additionally, different mechanism dominate at different temperatures, such trap assistance travel or lateral movement of change in the charge storage region dominating at low temperatures for both end of life (i.e., heavily cycled) and beginning of life (i.e., fresh) devices. Because of this, embodiments for power on data retention management, such as in FIG. 9, that use a single average activation energy, such a 1 eV, to calculate different data retention stress levels and thermal acceleration factors at different temperatures will often suffer from a waste of system resources, due to an overestimation of the equivalent data retention times leading to rotating out blocks of relatively good quality, or data loss, due to underestimated equivalent data retention times leading continuing to use blocks of deteriorated quality.

To account for this situation, the following embodiments present a dynamic activation energy table, of DEaT, that has different Ea values for different operating temperatures and cycle conditions to obtain a more accurate equivalent data retention time at the reference temperature. The table values can be determined as part of the device characterization process, for example, based on failed bit count values. The determined values can be used for a given generation of devices and stored into non-volatile memory, from where they can be retrieved as part of the power on process and stored in the tables 370 of the system control logic 360 for use during subsequent operations.

Figure 10:
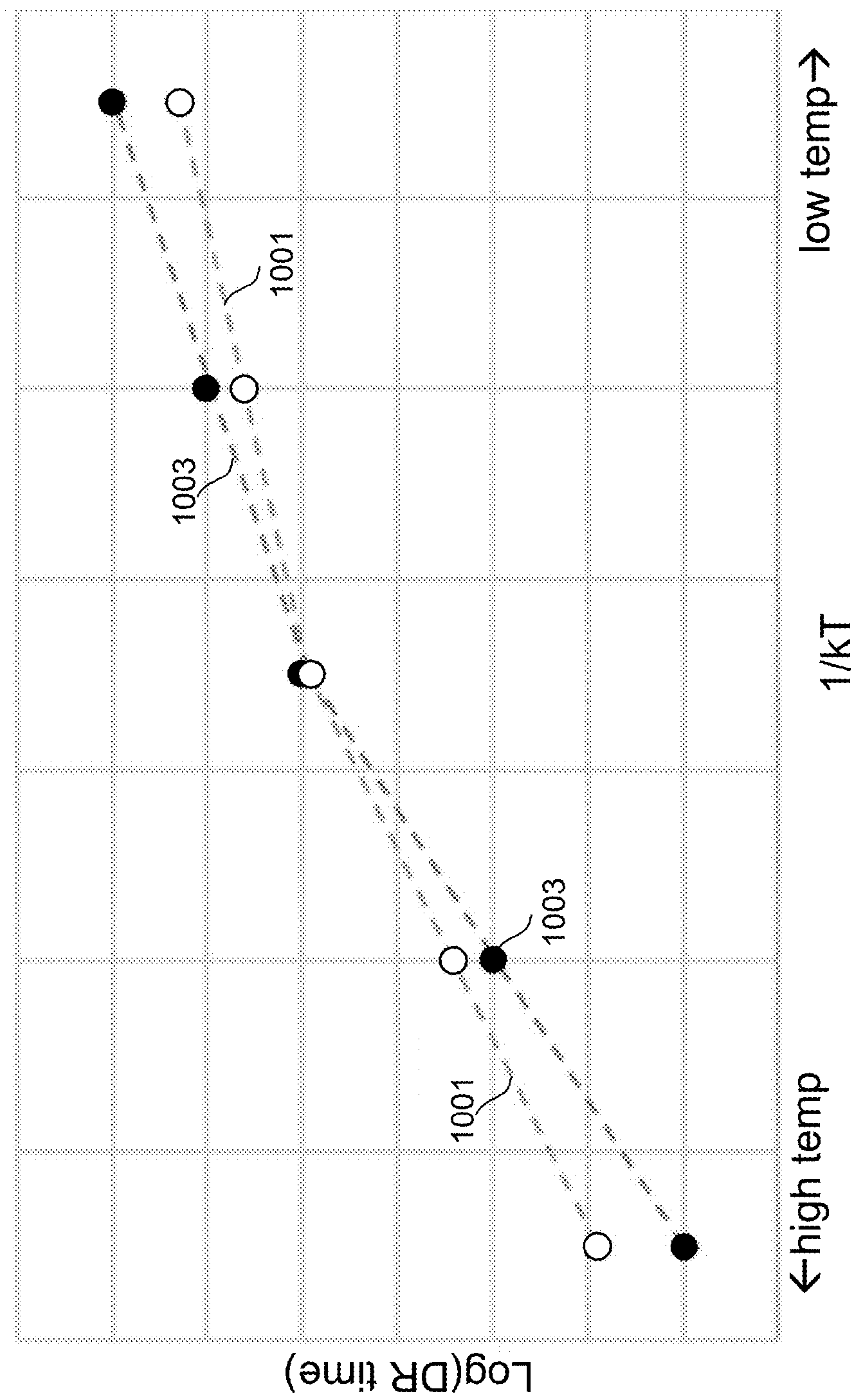
FIG. 10 illustrates an example of the different activation energies at beginning of life and end of life as a function of temperature.

FIG. 10 illustrates an example of the different activation energies at beginning of life and end of life as a function of temperature. In FIG. 11, the data retention time (in a log scale) is plotted against 1/kT. Consequently, higher temperatures are to the left and lower temperatures are to the right. Data for an end of life (EOL) device is shown at 1001 with data points marked with an open circle. Data for a beginning of life (BOL) device is shown at 1003 with data points marked with black circles. As shown, at higher temperatures, the Ea of the device is higher, while at lower temperatures, the Ea of the device is lower. In both cases, the Ea of the aged device is lower than that of the new device.

FIG. 11 illustrates an example of a dynamic activation energy table. In this embodiment, temperatures (in Celsius) are in one degree increments from 25 C to 100 C and values are determined for each temperature at beginning of life (BOL) and end of life (EOL). This embodiment includes BOL and EOL values that can be selected for a given temperature based on whether the program/erase cycle count is above or below a reference value. Other embodiments can use a single value or more than two values for a given temperature value. Further embodiments can, rather than select between two values (EOL, BOL), for example, based on whether a blocks program/erase count is above or below a reference value, interpolate between the EOL and BOL count based on a block's current count.

Figure 12:
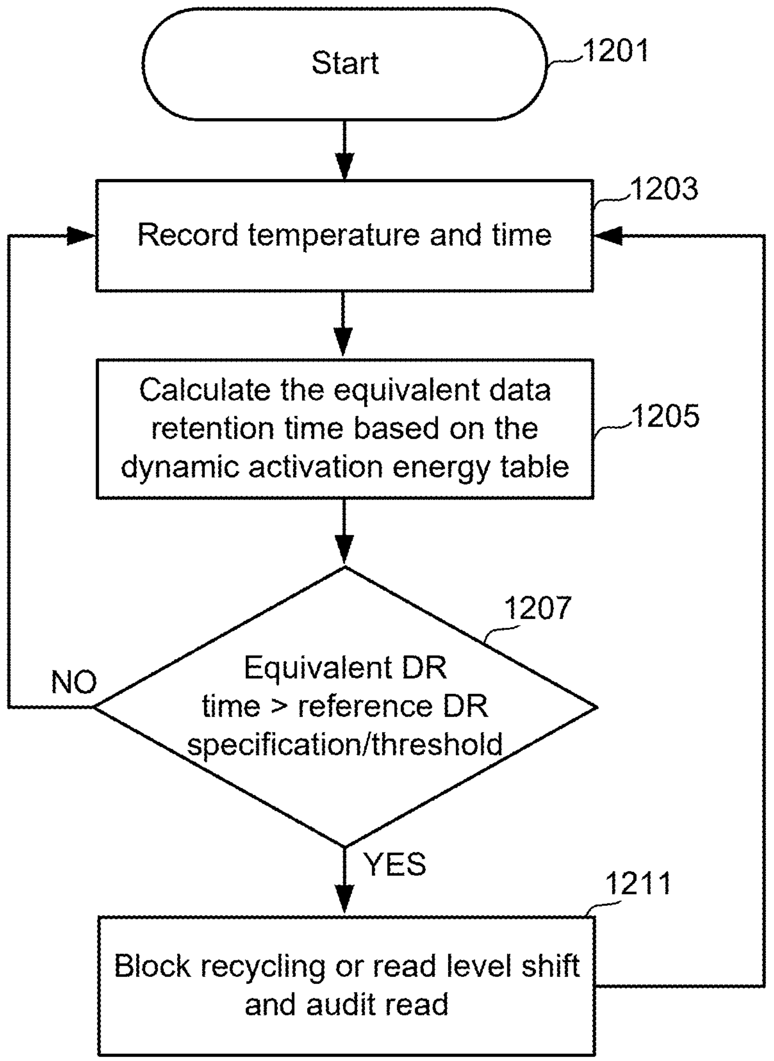
FIG. 12 is a flowchart of an embodiment for the incorporation of a dynamic activation energy table into a power on process.

FIG. 12 is a flowchart of an embodiment for the incorporation of a dynamic activation energy table into a power on process, arranged similarly to FIG. 9, but now with use of the dynamic activation energy table. Steps 1201 and 1203 can be as described above with respect to steps 901 and 903 of FIG. 9. Step 1205 calculates the equivalent data retention time, similarly to step 905, but now, rather than use a single activation energy, the data retention time is based on a dynamic activation energy table. The dynamic activation energy table can be read along with other operating parameters in step 704 of FIG. 7 and stored in the register tables 370 and/or in ROM memory of the memory controller 102 in step 706, from where it can be retrieved is step 1205 and, using the temperature and time values from step 1203, the equivalent data retention time can be computed using the thermal acceleration factor with the corresponding energy. The use of different activation energy values, calculated based on device test data and that are selected for calculation under different operating temperatures and cycle conditions, can be used to obtain a more accurate equivalent data retention time than at a single activation energy. Step 1207 compares whether the equivalent time exceeds the specification/threshold value similarly to step 907, and if so, perform a block recycling or read level shift and audit read step 1211, similarly to step 911.

To take an example, consider the case where the product specification for the data retention time is 24 hours at a reference temperature of 85 C. If the recorded data for a beginning of life device is that it has experienced a total of: 30 hours at 75 C; 186 hours at 55 C; and 2 hours at 95 C, the data retention time based on the dynamic activation energy table of FIG. 11 and thermal acceleration factor equation gives:

$$10.9 \text{ hours} + 8.0 \text{ hours} + 5.2 \text{ hours} = 24.1 \text{ hours}.$$

As this exceeds the product specification of 24 hours at the reference temperature, at step 1211 the system would execute block recycling or a read level shift and audit read.

Figure 13:
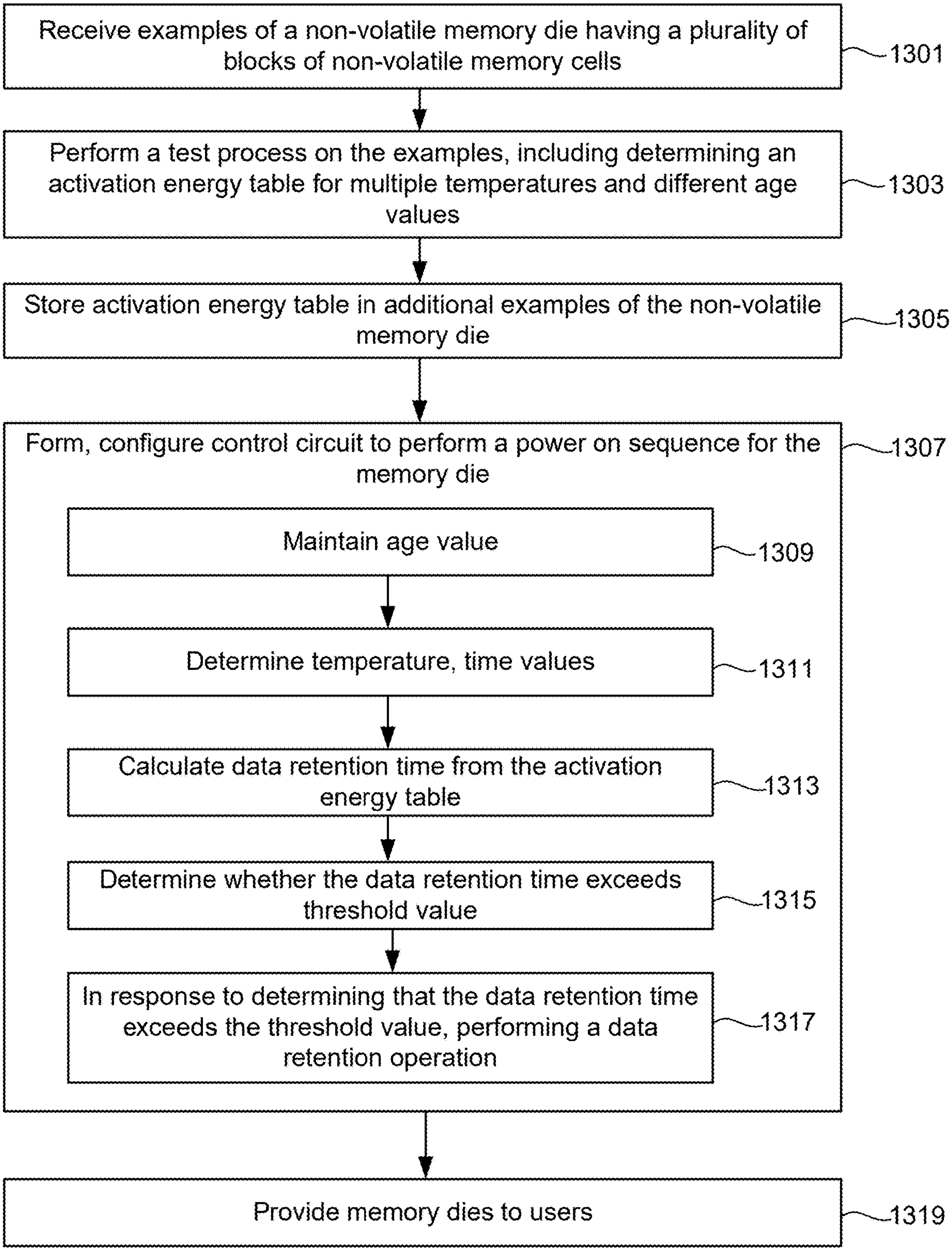
FIG. 13 is flowchart of an embodiment for incorporating a dynamic activation energy table into power on data retention management of a non-volatile memory device.

FIG. 13 is flowchart of an embodiment for incorporating a dynamic activation energy table into power on data retention management of a non-volatile memory device. The flow begins at step 1301 by receiving examples of a non-volatile memory die having a plurality of blocks of non-volatile memory cells that can be used for testing and device characterization. This can include the manufacturing of the dies or it may be the receiving at a test facility, for example, of dies fabricated elsewhere. The testing follows at step 1303 and now, in addition to other testing to establish device characteristics and set operating parameters, activation energy values across a range of multiple operating temperatures and, for each temperature, multiple age values for the die. These values can then be compiled into a table, such as in the example of the table in FIG. 11 where the temperature values range from 25 C to 100 C and the age values are a beginning of life value, such as a fresh device would have, and an end of life value, such as for a heavily cycled device. During the test process, the temperature values can be determined by the test equipment, a temperature sensor such as 399 on the memory die 300 or 301, or some combination of these. Embodiments for determining a device age value can include those based on the number of erase/program cycles of blocks of the memory, such as an average value or the number of blocks above some reference count, or on other factors such as failed bit counts or other measures of device error. Once complied, in step 1305 the activation energy table can then be stored on the memory die, such as in a block for system data, where the control circuitry can then access the table for use during power on operations.

The dynamic activation energy table can then be accessed and used by control circuitry for the memory die when subsequently in operation by a user. The control circuit for the memory die is formed in step 1307, where, depending on the embodiment, this can include forming some or all of the control circuit as part of the memory die (as in FIG. 5A) or forming a separate control die (as in control die 311 in FIG. 5B) that is then bonded to the memory die to from a bonded die pair. The control circuit is configured to perform the power on sequence in steps 1309-1317 using the dynamic activation energy table, which can performed by hardware, software, firmware, or some combination of these, with the firmware/software loaded as part of the configuration process.

Maintaining an age value for the memory die at step 1309 can based on maintaining program/erase cycle counts for blocks of the memory cells or based on failed bit counts or other error measured. This information can be used with the table of FIG. 11, for example, to determine whether to use the EOL or BOL values. Step 1311 determines a temperature values, such as from the temperature sensor 399, and a time value, such as based on a time stamp used to calculate the time since the preceding power off or power on. Based on the temperature value, the time value, and the age value, step 1313 can then determine a equivalent data retention time and step 1315 can determine whether this exceeds a threshold value, as described with respect to FIG. 12. Step 1317, corresponding to step 1211, then follows. Once the control circuit is configured, the memory device can be delivered to users at step 1319 and operated using steps 1309-1317 during power on operation.

As presented above, the use of a dynamic activation energy table that incorporates different activation energies at temperatures and devices ages can allow the system can calculate a more accurate equivalent data retention times across both high and low temperatures and at the beginning and end of life. This lead to fewer system resources being consumed while helping to reduce the risk of data loss. These dynamic activation energy table methods are highly compatible with existing methods and do not require large adjustments to firmware to implement.

One embodiment includes a non-volatile memory device comprising a control circuit configured to connect to a memory array comprising a plurality of blocks of non-volatile memory cells. The control circuit configured to: maintain, for the memory array, an activation energy table having entries for a plurality of temperature values and, for each of the temperature values, a plurality of entries corresponding to different age values for the memory array; maintain a current age value for the memory array; and receive a power on command. The control circuit is also configured to: in response to the power on command, determine a temperature value for the memory array and a time value for the array; calculate a data retention time for the memory array from the activation energy table using the determined temperature value, the time value, and the current age value for the memory array; determine whether the data retention time for the memory array exceeds a threshold value; and in response to determining that the data retention time for the memory array exceeds the threshold value, perform a data retention operation.

Still another embodiment includes a method, comprising: receiving one or more examples of a non-volatile memory die having a plurality of blocks of non-volatile memory cells; performing a test process on the examples of the memory die, including determining an activation energy table having entries for a plurality of temperature values and, for each of the temperature values, a plurality of entries corresponding to different age values for the memory die; storing the activation energy table in additional examples of the non-volatile memory die; and forming a corresponding control circuit for the memory die for each of the additional examples of the non-volatile memory die. Forming the corresponding control circuit includes configuring the control circuit to perform a power on sequence for the corresponding memory die that comprises: maintaining an age value for the memory die; determining a temperature value for memory die and a time value for the die; calculating a data retention time for the memory die from the activation energy table using the determined temperature value, the time value, and the age value for the memory die; determining whether the data retention time for the memory die exceeds a threshold value; and in response to determining that the data retention time for the memory die exceeds the threshold value, performing a data retention operation.

One embodiment includes a non-volatile memory device, comprising: an array having a plurality of non-volatile memory cells and storing an activation energy table having entries for a plurality of temperature values and, for each of the temperature values, a plurality of entries corresponding to different age values for the memory array; a temperature sensor configured to determine a temperature value for the array; and one or more control circuits configured to connect to the array. The control circuits are configured to: maintain an age value for the memory array; determine a temperature value for memory array and a time value for the array; calculate a data retention time for the memory array from the activation energy table using the determined temperature value, the time value, and the age value for the memory array; determine whether the data retention time for the memory array exceeds a threshold value; and, in response to determining that the data retention time for the memory array exceeds the threshold value, perform a data retention operation.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term “based on” may be read as “based at least in part on.”

For purposes of this document, without additional context, use of numerical terms such as a “first” object, a “second” object, and a “third” object may not imply an ordering of objects, but may instead be used for identification purposes to identify different objects.

For purposes of this document, the term “set” of objects may refer to a “set” of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
a control circuit configured to connect to a memory array comprising a plurality of blocks of non-volatile memory cells, the control circuit configured to:
maintain, for the memory array, an activation energy table having entries for a plurality of temperature values and, for each of the temperature values, a plurality of entries each corresponding to a different value for a wear level of the memory array;
maintain a current value for the wear level of the memory array;
receive a power on command;
in response to the power on command, determine a current time value for the memory array and a current temperature value at the current time value for the memory array;
calculate a data retention time, indicating for how long the data has been retained, for the memory array from the activation energy table using the determined current temperature value, the current time value, and the current wear level value for the memory array;
determine whether the data retention time for the memory array exceeds a threshold value; and
in response to determining that the data retention time for the memory array exceeds the threshold value, perform a data retention operation.

2. The non-volatile memory device of claim 1, wherein at least a portion of the control circuit is formed on a control die, the non-volatile memory device further comprising:
a memory die including the memory array, the memory die formed separately from and bonded to the control die.

3. The non-volatile memory device of claim 1, wherein:
the plurality of entries corresponding to different wear level values for the memory array includes the control circuit includes, for each temperature value, an initial value corresponding to a fresh device and a heavily cycled device value.

4. The non-volatile memory device of claim 1, wherein the memory array comprises a plurality of blocks each comprising a plurality of the non-volatile memory cells, and wherein the control circuit is further configured to:
for each of the blocks, maintain a count of a number of program-erase cycles that the block has experienced, and wherein maintaining the current wear level value includes determining the current wear level value from the blocks' numbers of program-erase cycle.

5. The non-volatile memory device of claim 4, wherein the control circuit is further configured to:
determine the current wear level value from the number of blocks having a program-erase count over a reference level.

6. The non-volatile memory device of claim 1, wherein activation energy table is determined from device characterization testing.

7. The non-volatile memory device of claim 6, wherein the activation energy table is stored in the memory array and the control circuit is further configured to:
in response to the power on command, read out the activation energy table from the memory array; and
store a copy of the activation energy table in a register memory dedicated to the control circuit.

8. The non-volatile memory device of claim 1, wherein to determine the current time value comprises the control circuit is further configured to:
determine a time elapsed between receiving the power on command and a previous power on command.

9. The non-volatile memory device of claim 1, wherein to calculate the data retention time the control circuit is further configured to:
calculate a thermal acceleration factor from the determined current temperature value, the current wear level value, and the activation energy table.

10. The non-volatile memory device of claim 1, wherein the control circuit comprises:
a temperature sensor configured to determine the current temperature value and formed on a die with the memory array.

11. The non-volatile memory device of claim 1, wherein the data retention operation is a block recycling operation.

12. The non-volatile memory device of claim 1, wherein, to perform the data retention operation, the control circuit is further configured to:
read the memory cells with shifted read levels.

13. A method, comprising:
receiving one or more examples of a non-volatile memory die having a plurality of blocks of non-volatile memory cells;
performing a test process on the examples of the memory die, including determining an activation energy table having entries for a plurality of temperature values and, for each of the temperature values, a plurality of entries corresponding to different wear level values for the memory die;
storing the activation energy table in additional examples of the non-volatile memory die; and
forming a corresponding control circuit for the memory die for each of the additional examples of the non-volatile memory die, including configuring the control circuit to perform a power on sequence for the corresponding memory die that comprises:
maintaining a wear level value for the memory die;
determining a temperature value for memory die and a time value for the die;
calculating a data retention time, indicating for how long the data has been retained, for the memory die from the activation energy table using the determined temperature value, the time value, and the wear level value for the memory die;

determining whether the data retention time for the memory die exceeds a threshold value; and in response to determining that the data retention time for the memory die exceeds the threshold value, performing a data retention operation.

14. The method of claim 13, wherein forming the control circuit includes:

forming the control circuit on the corresponding memory die having the plurality of blocks.

15. The method of claim 13, wherein forming the control circuit includes:

forming the control circuit on a control die; and bonding the control die to the corresponding memory die having the plurality of blocks.

16. The method of claim 13, wherein determining an activation energy table having entries corresponding to different wear level values for each temperature values includes, for each temperature value, a beginning of life value and an end of life value.

17. The method of claim 13, wherein maintaining the wear level value for the memory die includes:

for each of the blocks, maintaining a count of a number of program-erase cycles that the block has experienced, and wherein maintaining the wear level value includes determining the wear level value from the blocks' numbers of program-erase cycle.

18. The method of claim 13, wherein performing the data retention operation includes:

performing a block recycling operation.

19. The method of claim 13, wherein performing the data retention operation includes:

reading the memory cells with shifted read levels.

20. A non-volatile memory device, comprising:

an array having a plurality of non-volatile memory cells and storing an activation energy table having entries for a plurality of temperature values and, for each of the temperature values, a plurality of entries corresponding to different wear level values for the memory array;

a temperature sensor configured to determine a temperature value for the array; and one or more control circuits configured to connect to the array and configured to:

maintain wear level value for the memory array;

determine a temperature value for memory array and a time value for the array;

calculate a data retention time, indicating for how long the data has been retained, for the memory array from the activation energy table using the determined temperature value, the time value, and the wear level value for the memory array;

determine whether the data retention time for the memory array exceeds a threshold value; and in response to determining that the data retention time for the memory array exceeds the threshold value, perform a data retention operation.

* * * * *